(12) United States Patent
Fujiwara et al.

(10) Patent No.: US 11,670,356 B2
(45) Date of Patent: Jun. 6, 2023

(54) APPARATUSES AND METHODS FOR REFRESH ADDRESS MASKING

(71) Applicant: MICRON TECHNOLOGY, INC., Boise, ID (US)

(72) Inventors: Yoshinori Fujiwara, Boise, ID (US); Harish V. Gadamsetty, Allen, TX (US); Gary Howe, Allen, TX (US); Dennis G. Montierth, Meridan, ID (US); Michael A. Shore, Boise, ID (US); Jason M. Johnson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/305,878

(22) Filed: Jul. 16, 2021

(65) Prior Publication Data
US 2023/0020753 A1   Jan. 19, 2023

(51) Int. Cl.
| | |
|---|---|
| *G11C 11/406* | (2006.01) |
| *G11C 11/408* | (2006.01) |
| *G11C 29/44* | (2006.01) |
| *G11C 29/00* | (2006.01) |
| G11C 29/12 | (2006.01) |

(52) U.S. Cl.
CPC .... *G11C 11/40622* (2013.01); *G11C 11/4085* (2013.01); *G11C 11/4087* (2013.01); *G11C 29/4401* (2013.01); *G11C 29/787* (2013.01); G11C 2029/1202 (2013.01)

(58) Field of Classification Search
CPC .......... G11C 11/40622; G11C 11/4085; G11C 11/4087; G11C 29/4401; G11C 29/787; G11C 2029/1202
See application file for complete search history.

(56) References Cited

U.S. PATENT DOCUMENTS

| | | |
|---|---|---|
| 5,670,993 A | 9/1997 | Greene et al. |
| 6,005,823 A | 12/1999 | Martin et al. |
| 6,438,055 B1 | 8/2002 | Taguchi et al. |
| 9,373,422 B1 | 6/2016 | Kwean |
| 10,381,064 B1 | 8/2019 | Morohashi |

(Continued)

FOREIGN PATENT DOCUMENTS

KR   20170113115 A   10/2017

OTHER PUBLICATIONS

U.S. Appl. No. 16/538,603 titled "Apparatuses and Methods for Refreshing Memory of a Semiconductor Device" filed Aug. 12, 2019, pp. all.

(Continued)

*Primary Examiner* — Tri M Hoang
(74) *Attorney, Agent, or Firm* — Dorsey & Whitney LLP

(57) ABSTRACT

Apparatuses, systems, and methods for refresh address masking. A memory device may refresh word lines as part of refresh operation by cycling through the word lines in a sequence. However, it may be desirable to avoid activating certain word lines (e.g., because they are defective). Refresh masking logic for each bank may include a fuse latch which stores a selected address associated with a word line to avoid. When a refresh address is generated it may be compared to the selected address. If there is a match, a refresh stop signal may be activated, which may prevent refreshing of the word line(s).

17 Claims, 7 Drawing Sheets

(56) References Cited

U.S. PATENT DOCUMENTS

| | | |
|---|---|---|
| 10,490,250 B1 | 11/2019 | Ito et al. |
| 10,910,034 B2 | 2/2021 | Morohashi |
| 11,152,078 B1 | 10/2021 | Du et al. |
| 11,417,382 B2 | 8/2022 | Arai |
| 2003/0043672 A1 | 3/2003 | Inoue et al. |
| 2003/0086311 A1 | 5/2003 | Benedix et al. |
| 2006/0198207 A1 | 9/2006 | Ishikawa |
| 2008/0285370 A1 | 11/2008 | Okuyama |
| 2009/0213671 A1 | 8/2009 | Koo |
| 2011/0051528 A1 | 3/2011 | Kim |
| 2011/0066798 A1* | 3/2011 | Kaiwa ............... G11C 11/4093 711/E12.001 |
| 2011/0194367 A1 | 8/2011 | Wong et al. |
| 2012/0089773 A1 | 4/2012 | Chang |
| 2015/0049564 A1 | 2/2015 | Hosoe |
| 2017/0287547 A1* | 10/2017 | Ito ..................... G11C 29/783 |
| 2019/0228814 A1* | 7/2019 | Morohashi .......... G11C 11/4097 |
| 2019/0362775 A1 | 11/2019 | Morohashi |

OTHER PUBLICATIONS

U.S. Appl. No. 17/125,051 titled "Apparatuses and Methods for Redundance Match Control at Refresh to Disable Wordline Activation" filed Dec. 17, 2020, pp. all.

U.S. Appl. No. 17/005,579, titled "Apparatuses and Methods for Refreshing Memories With Redundancy" filed Aug. 28, 2020, pp. all.

U.S. Appl. No. 15/875,985, titled 'Apparatuses and Methods for Refreshing Memories of a Semiconductor Device' filed Aug. 28, 2020, pp. all.

U.S. Appl. No. 17/889,183 titled "Apparatuses and Methods for Redundance Match Control at Refresh to Disable Wordline Activation" filed Aug. 16, 2022.

"International Search Report and Written Opinion for PCT/US2022/035809, dated Oct. 20, 2022".

* cited by examiner

APPARATUSES AND METHODS FOR REFRESH ADDRESS MASKING

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

The memory may also carry out repair operations, where defective memory cells are disabled. For example, an address previously associated with a defective word line may be reassigned to a redundant word line and the defective word line may be disabled. However, there may be circumstances where the defective word line is still refreshed as part of a refresh cycle of the memory. It may be useful to manage the interaction of defective word lines and refresh operation.

DETAILED DESCRIPTION

Figure 1:
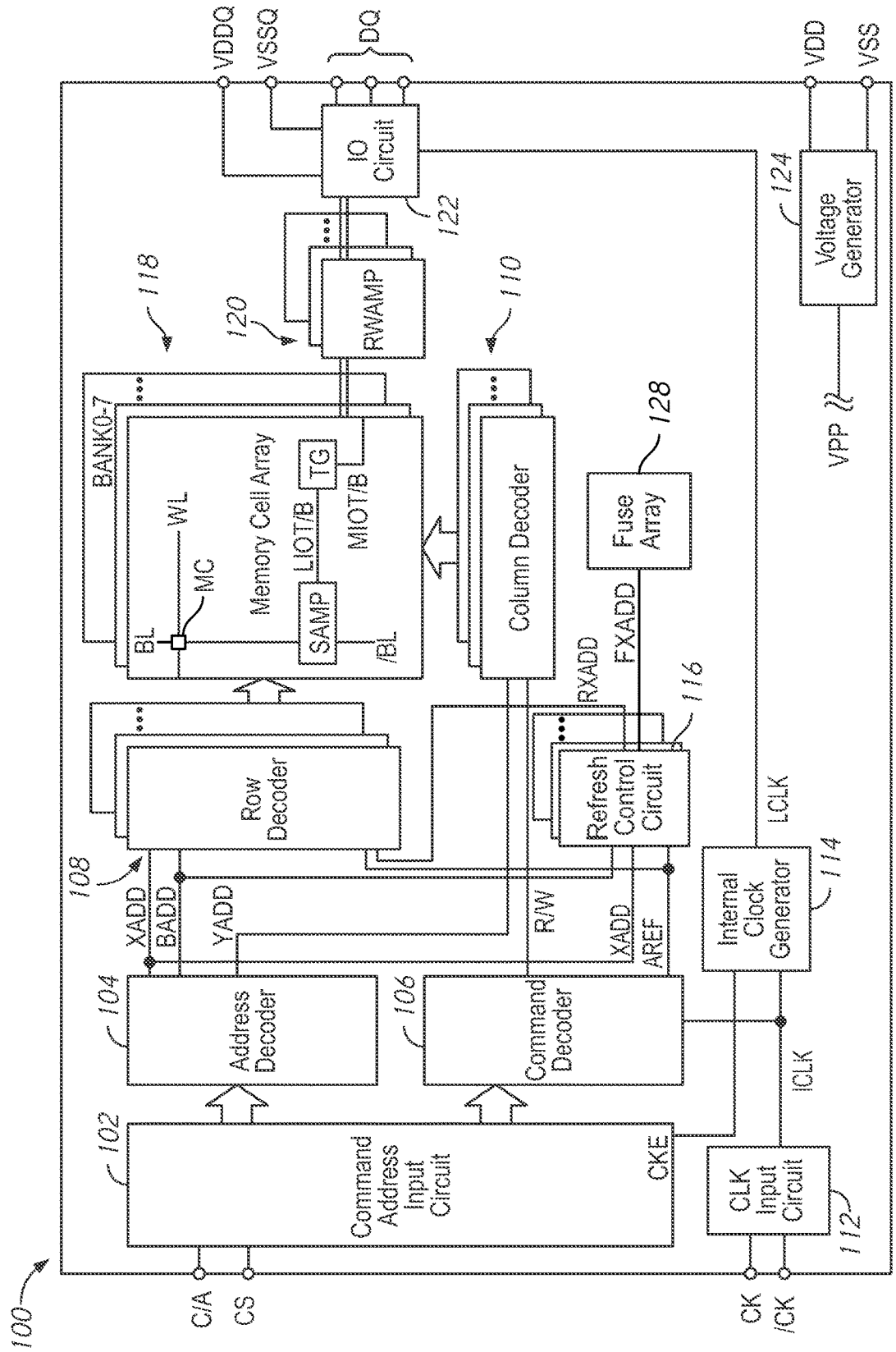
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (wordlines) and columns (bit lines), in each bank of a memory array. The memory cells may be refreshed on a row-by-row basis. In order to prevent information from being lost or corrupted due to this decay, the memory may carry out a background refresh process, such as auto-refresh or self-refresh operations. During a refresh operation, information may be rewritten to the wordline to restore its initial state. The memory may perform a refresh cycle by performing refresh operations on the wordlines of the memory in a sequence such that over time the wordlines of the memory are refreshed at a rate faster than the expected rate of data degradation.

A memory array may include one or more memory cells which are defective (e.g., due to manufacturing defects). These defective memory cells may be identified, and repair operations may be performed to enable redundant memory cells in the place of the defective memory cells. For example, a defective word line (e.g., a word line that contains at least one defective memory cell) may be identified and a row address which was associated with the defective word line may be reassigned to a redundant word line (e.g., by blowing one or more fuses).

In a conventional memory device, during a refresh cycle, the defective word lines may be refreshed, even if they have already been repaired. This may present problems based on the type of defect in the defective word line. In some situations, certain defective word lines may operate outside of the device's specification (e.g., may take too long to turn off), which in turn may cause errors or even damage to the memory device. However, it may take too much time to determine if a given refresh address is associated with any of the defective word lines. Accordingly, there is a need for high speed determination of whether or not a refresh address is associated with selected defective word lines.

The present disclosure is drawn to apparatuses, systems, and methods for refresh address masking. Each bank of the memory may have a refresh address masking circuit. The refresh address masking circuit may be programmed with a selected address (e.g., by programming fuses). The selected address may represent an address of a defective word line which was identified as being particularly dangerous if it were to be refreshed. For example it may be a word line identified during a testing operation. It should be noted that the selected address may represent an address which is particularly defective, and not any amount of damage. For example, a bank may have several repaired rows, none of which represents enough of a problem to be the selected row.

A refresh address generator may generate a refresh address (e.g., a CAS-before-RAS or CBR address) and may compare that CBR address to the programmed selected address. If there is a match, the mask circuit may provide a refresh stop signal which may prevent the word line(s) associated with that CBR address from being refreshed. Since the refresh masking circuit may be bank specific and may only need to compare the current CBR address to a relatively small number of selected addresses, it may operate relatively quickly, which may allow for the selected addresses to be masked without slowing down the operation of the memory.

In some embodiments, the CBR address may be associated with multiple word lines. For example, a portion of the CBR address may be truncated (compared to a normal row address), and the CBR address may be associated with every word line which shares the remaining bits of the CBR address in common. For example, if two bits are truncated from the CBR address, it may be associated with four word lines, if three bits are truncated then it may be associated with eight word lines, etc. In some embodiments, all of the word lines associated with the CBR address which matches the selected address may be skipped. In some embodiments, the refresh masking logic may identify the specific word line associated with the selected address within the group of word lines associated with the CBR address and may only skip that word line.

As used herein, truncated may refer to addresses in which some bits which are normally used as part of that address are missing/ignored. For example, if a normal row address is 16 bits, and two bits are ignored, then the truncated address may have 14 bits. In some situations, the truncated bits may be removed from the address entirely (e.g., only 14 bits are received instead of 16). In some situations, all of the bits may be received, but some may be ignored (e.g., 16 bits are received, but two are not used). While certain examples may be given in terms of number of bits truncated, or which bits of an address are truncated, it should be understood that these may vary in other embodiments.

FIG. 1 is a block diagram of a semiconductor device according to an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122.

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a refresh mode. In some embodiments, the refresh mode command may be externally issued to the memory device 100. In some embodiments, the refresh mode command may be periodically generated by a component of the device. In some embodiments, when an external signal indicates a refresh entry command, the refresh signal AREF may also be activated. The refresh signal AREF may be used to control the timing of refresh operations during the refresh mode. The signal AREF may be generated with periodic timing during the refresh mode. Thus, refresh operations may continue automatically. A refresh mode exit command (which may be from an external controller and/or may be internally generated) may cause the periodic activation of the refresh signal AREF to stop and may cause the device 100 to return to an idle state and/or resume other operations.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. For example, the refresh address RXADD may be truncated compared to the row address XADD, and the refresh address RXADD may be associated with every word line which shares the non-truncated portion of the address in common. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of wordlines represented by the address), or may operate based on internal logic.

The refresh control circuit 116 may selectively output a targeted refresh address which specifies one or more victim address based on an identified aggressor wordline or an automatic refresh address (e.g. a CAS before RAS or CBR address) which is part of a sequence of addresses as the refresh address RXADD. Based on the type of refresh address RXADD (and in some embodiments, one more additional signals indicating the type of operation), the row decoder 108 may perform a targeted refresh or CBR refresh operation. The automatic refresh addresses may be generated as part of a sequence of addresses which are intended to refresh all of the word lines in the memory array 118. The refresh control circuit 116 may cycle through the sequence of refresh addresses at a rate determined by AREF. The auto-refresh operations may generally occur with a timing such that the sequence of CBR addresses is cycled such that no information is expected to degrade in the time between refresh operations for a given wordline. In other words, refresh operations may be performed such that each wordline is refreshed at a rate faster than the expected rate of information decay.

The memory array may include one or more word lines which are defective (e.g., due to manufacturing defects. These word lines may be disabled, and the row address previously associated with the defective word line may be repaired by reassigning that address to a redundant word line of the memory array 118. For example, changes may be made to a fuse array 128 to assign the address to a redundant row. However, during refresh operations, the defective word line may still be refreshed. In situations where the defect in the word line is particularly severe, this may disrupt operations in the memory device 100 or even cause damage to the device or information stored therein.

Accordingly, the memory device 100 may be programmed with one or more selected addresses FXADD which indicate defective rows which should not be refreshed. The selected address(es) FXADD may represent defective word lines which if activated would operate outside of the device's specification. Most of the defective word lines in a given bank may not be sufficiently damaged to represent problems if activated and may be refreshed as normal (although the refreshing may serve no practical purpose if the word line is disabled as part of a repair operation). Accordingly, the selected address FXADD may represent a repaired word line, but not all repaired word lines may be the selected address FXADD. Similarly, a memory bank may have a number of repaired word lines, and no selected address FXADD.

These selected addresses FXADD may be identified, for example, during testing. For example, the time it takes word line to close may be measured, and the selected address(es) may be word lines which have a closing time which exceeds a threshold. In addition to being identified as the selected address FXADD, the selected address may also be identified as a detective address, and may be repaired by mapping the selected address FXADD to a redundant word line for access purposes. However refresh operations may bypass the redundancy logic which would identify FXADD (or any other defective word line) as repaired, and thus those defective word lines may normally be refreshed. The selected address FXADD may thus be identified and stored (e.g., in the fuse array) so that refresh operations on the word line associated with FXADD may be prevented.

In some embodiments, the selected addresses may be stored in the fuse array 128 (e.g., by blowing one or more fuses). Each selected address FXADD may be associated with a specific bank of the memory array 118, and may be loaded into a fuse latch associated with that bank. Each bank may support a certain number of selected addresses FXADD (e.g., 1 selected address per bank, 2 selected addresses per bank, etc.), and the selected address(es) may be bank specific. During refresh operations, the refresh control circuit 116 may compare the CBR address to the selected address. If there is a match, the refresh control circuit 116 may provide a refresh stop signal at an active level. Responsive to the refresh stop signal at the active level, the row decoder 108 may mask the refresh address RXADD and will not refresh the word line(s) associated with the refresh address. This may prevent activation of the defective word line associated with the selected address FXADD during refresh operations. If the refresh stop signal is inactive, the refresh address RXADD may be passed and the wordline(s) associated with RXADD will be refreshed.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. The refresh control circuit 116 may use one or more signals of the device 100 to calculate the targeted refresh address RXADD. For example, the refresh address RXADD may be a calculated based on the row addresses XADD provided by the address decoder. Since the targeted refresh addresses are based on rows which are being accessed, in some embodiments, it may not be necessary to check targeted refresh addresses against the selected address FXADD, as the selected address represents a defective word line which will not be accessed.

The power supply terminals are supplied with power supply potentials VDD and VSS. The power supply potentials VDD and VSS are supplied to an internal voltage generator circuit 124. The internal voltage generator circuit 124 generates various internal potentials VPP and other internal voltages based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
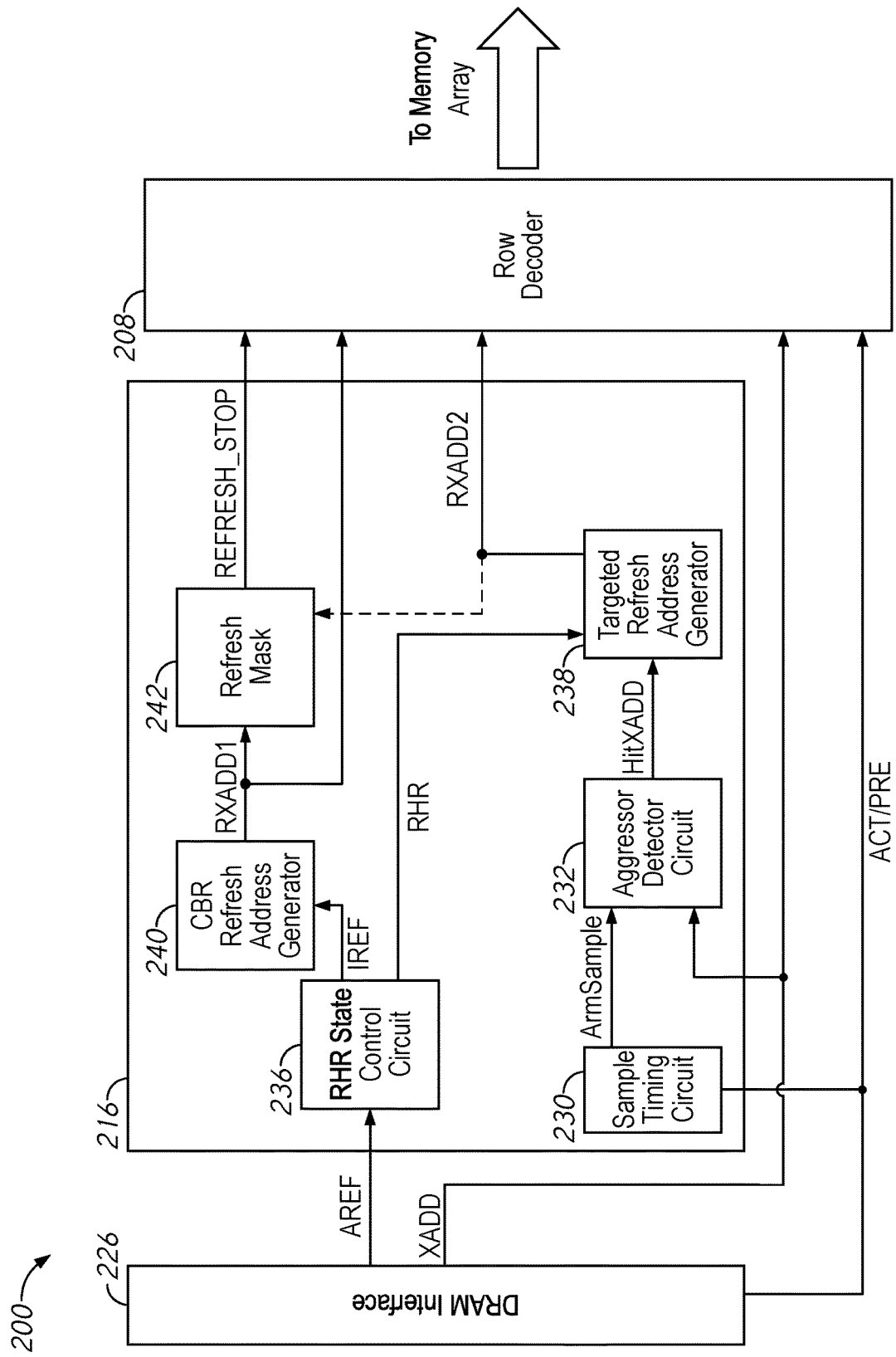
FIG. 2 is a block diagram of a refresh control according to an embodiment of the present disclosure.

FIG. 2 is a block diagram of a refresh control circuit according to an embodiment of the present disclosure. The refresh control circuit 216 may, in some embodiments, be included in the refresh control circuit 116 of FIG. 1. Certain internal components and signals of the refresh control circuit 216 are shown to illustrate the operation of the refresh control circuit 216. The refresh control circuit 216 and row decoder 208 may correspond to a particular bank of memory, and these components may be repeated for each of the banks of memory.

A DRAM interface 226 may provide one or more signals to an address refresh control circuit 216 and row decoder 208. The refresh control circuit 216 may include a sample timing circuit 230, an aggressor detector circuit 232, a row hammer refresh (RHR) state control circuit 236 and a refresh address generators 238 and 240. The DRAM interface 226 may provide one or more control signals, such as a refresh signal AREF, and a row address XADD. The refresh control circuit 216 provides refresh addresses RXADD1 and/or RXADD2 with timing based on the refresh signal AREF, wherein some of the refresh addresses are based on the received row address XADD.

In some embodiments, the aggressor detector circuit 232 may sample the current row address XADD responsive to an activation a sampling signal ArmSample. The aggressor detector circuit 232 may be coupled to the row addresses XADD along the address bus, but may only receive (e.g., process, pay attention to) the current value of the row address XADD when there is an activation of the sampling signal ArmSample. The sampled addresses may be stored in the aggressor circuit 232 and/or compared to previously stored addresses. The aggressor detector circuit 232 may provide a match address HitXADD (e.g., an identified aggressor address) based on a currently sampled row address XADD and bank address and/or previously sampled row addresses and bank addresses. The aggressor address HitXADD may be a sampled/stored row address and may be directed to bank level circuits (e.g., local aggressor storage 238) based on the hank address which was sampled/stored along with the sampled stored row address.

The RHR state control circuit 236 may provide the signal RHR to indicate that targeted refresh operation (e.g., a refresh of the victim rows corresponding to an identified aggressor row) should occur. The RHR state control circuit 236 may also provide an internal refresh signal IREF, to indicate that an CBR refresh should occur. Responsive to an activation of the signal RHR, the targeted refresh address generator 238 may provide a refresh address RXADD2, which may be one or more victim addresses corresponding to victim rows of the aggressor row corresponding to the match address HitXADD stored in the local aggressor storage 238 (or directly provided by the aggressor detector circuit 232). Responsive to an activation of IREF, the CBR refresh address generator 240 may provide a CBR refresh address RXADD1.

The RHR state control circuit 236 may provide a set of activations of RHR and IREF responsive to the refresh signal AREF, representing a number of refresh pumps to each activation of the refresh signal AREF. The row decoder 208 may perform a targeted refresh operation responsive to the refresh address RXADD2 and the row hammer refresh signal RHR. The row decoder 208 may perform an CBR refresh operation based on the refresh address RXADD1 and the internal refresh signal IREF.

The DRAM interface 226 may represent one or more components which provides signals to components of the bank. In some embodiments, the DRAM interface 226 may represent a memory controller coupled to the semiconductor memory device (e.g., device 100 of FIG. 1). In some embodiments, the DRAM interface 226 may represent components such as the command address input circuit 102, the address decoder 104, and/or the command decoder 106 of FIG. 1. The DRAM interface 226 may provide a row address XADD, a bank address the refresh signal AREF, and access signals such as an activation signal ACT and a pre-charge signal PRE. The refresh signal AREF may be a periodic signal which may indicate when an CBR refresh operation is to occur. The access signals ACT and PRE may generally be provided as part of an access operation along with a row address XADD. The activation signal ACT may be provided to activate a bank and row of the memory associated with the associated bank and row address. The pre-charge signal PRE may be provided to pre-charge the bank and row of the memory specified by the bank and row address. The row address XADD may be a signal including multiple bits (which may be transmitted in series or in parallel) and may correspond to a specific row of an activated memory bank.

In the example embodiment of FIG. 2, the refresh control circuit 216 uses sampling to monitor a portion of the addresses XADD provided along the address bus. Accordingly, instead of responding to every address, the refresh control circuit 216 may sample the current value of the address XADD on the address bus, and may determine which addresses are aggressors based on the sampled addresses. The timing of sampling by the refresh control circuit 216 may be controlled by the sample timing circuit 230 which provides the sampling signal ArmSample. The sample timing circuit 230 may provide activations of the sampling signal ArmSample, and each activation of the signal ArmSample may indicate that a current value of the row address should be sampled. An activation of ArmSample may be a 'pulse', where ArmSample is raised to a high logic level and then returns to a low logic level. The activations of the signal ArmSample may be provided with periodic timing, random timing, semi-random timing, pseudo-random timing, timing based on one or more signals (e.g., ACT/PRE) or combinations thereof. In other embodiments, sampling may not be used, and the aggressor detector circuit 232 may receive every value of the row address XADD and along the row address bus.

The aggressor detector circuit 232 may determine aggressor addresses based on one or more of the sampled row and bank addresses, and then may provide the determined aggressor address as the match address HitXADD. The aggressor detector circuit 232 may include a data storage unit (e.g., a number of registers), which may be used to store sampled row and bank addresses. When the aggressor detector circuit 232 samples a new value of the row address XADD (e.g., responsive to an activation of ArmSample) it may compare the sampled row and bank address to the row/bank addresses stored in the data storage unit. In some embodiments, the match address HitXADD may be one of the addresses stored in the aggressor detector circuit 232 which has been matched by the sampled addresses the most frequently.

The RHR state control circuit 236 may receive the refresh signal AREF and provide the refresh signal IREF and the row hammer refresh signal RHR. The refresh signal AREF may be periodically generated and may be used to control the timing of refresh operations. The memory device may carry out a sequence of refresh operations using CBR addresses (e.g., a CBR refresh), such as auto-refresh or self-refresh operations, in order to periodically refresh the rows of the memory device. The RHR signal may be generated in order to indicate that the device should refresh a particular targeted row (e.g., a victim row) instead of an address from the sequence of CBR refresh addresses. The RHR state control circuit 236 may also provide an internal refresh signal IREF, which may indicate that an refresh operation using an CBR address should take place. In some embodiments, the signals RHR and IREF may be generated such that they are not active at the same time (e.g., are not both at a high logic level at the same time). In some embodiments, IREF may be activated for every refresh operation, and an refresh operation using a CBR address may be performed unless RHR is also active, in which case a targeted refresh operation is performed instead.

In some embodiments, the refresh control circuit 216 may perform multiple refresh operations responsive to each activation of the refresh signal AREF. For example, each time the refresh signal AREF is received, the refresh control circuit 216 may perform N different refresh operations, by providing N different refresh addresses RXADD. Each refresh operation may be referred to as a 'pump'. The different pumps generated in response to the refresh signal AREF may be a mix of CBR refresh and targeted refresh operations. For example, if 4 pumps are generated, two may be used for CBR refresh operations and two may be used for targeted refresh operations. Other patterns may be used in other embodiments. In some embodiments, the pattern of targeted and CBR refresh operations may vary between different groups of pumps.

The targeted refresh address generator 238 may receive the row hammer refresh signal RHR and the match address HitXADD. The match address HitXADD may represent an aggressor row. The targeted refresh address generator 238 may determine the locations of one or more victim rows based on the match address HitXADD and provide them as the refresh address RXADD when the signal RHR indicates a targeted refresh operation. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples. For example, +/−3, +/−4, and/or other rows may also be refreshed.

The row decoder 208 may perform one or more operations on the memory array (not shown) based on the received signals and addresses. For example, responsive to the activation signal ACT and the row address XADD (and IREF and RHR being at a low logic level), the row decoder 208 may direct one or more access operations (for example, a read operation) on the specified row address XADD. Responsive to the RHR signal being active, the row decoder 208 may refresh the refresh address RXADD1 or RXADD2.

The CBR refresh address generator 240 may generate an CBR refresh address (or CBR refresh address) RXADD1 based on the signal IREF. The CBR refresh address generator 240 may use logic to cycle through addresses for all of the word lines in the memory array. For example, the CBR refresh address generator 240 may include a counter which increments a value of RXADD1 each time the signal IREF is received. In some embodiments, the refresh address RXADD1 may be associated with several word lines at once. For example, the refresh address RXADD1 may be a truncated address which is shortened by some number of bits (e.g., the bits may be removed, or may be ignored).

The refresh control circuit 216 includes a refresh mask circuit 242 which compares the refresh address RXADD1 to a selected address FXADD. The selected address FXADD may be stored in a fuse latch (not shown) associated with the same memory bank as the refresh control circuit 216. The refresh mask circuit 242 may provide a signal REFRESH_STOP at an active level if there is a match between the selected address FXADD and the refresh address RXADD1. If there is not a match, the signal REFRESH_STOP may be inactive. Responsive to the signal REFRESH_STOP at an active level, the row decoder 208 will not perform a refresh operation on one or more word lines associated with RXADD1.

In some embodiments, the targeted refresh address RXADD2 may be used to generate the REFRESH_STOP signal. For example, as shown by the dotted line, the targeted refresh address generator 238 may provide the address RXADD2 to the refresh mask circuit 242. Similar to the process described herein for RXADD1, the refresh mask circuit may compare the address RXADD2 to the selected address FXADD and provide the signal REFRESH_STOP at an active level if there is a match. This may be useful for situations where the victim address RXADD2 is a defective row which should not be activated. Responsive to the signal REFRESH_STOP at the active level, the row decoder 208 will not perform a refresh operation on the word line(s) associated with RXADD2.

Figure 3:
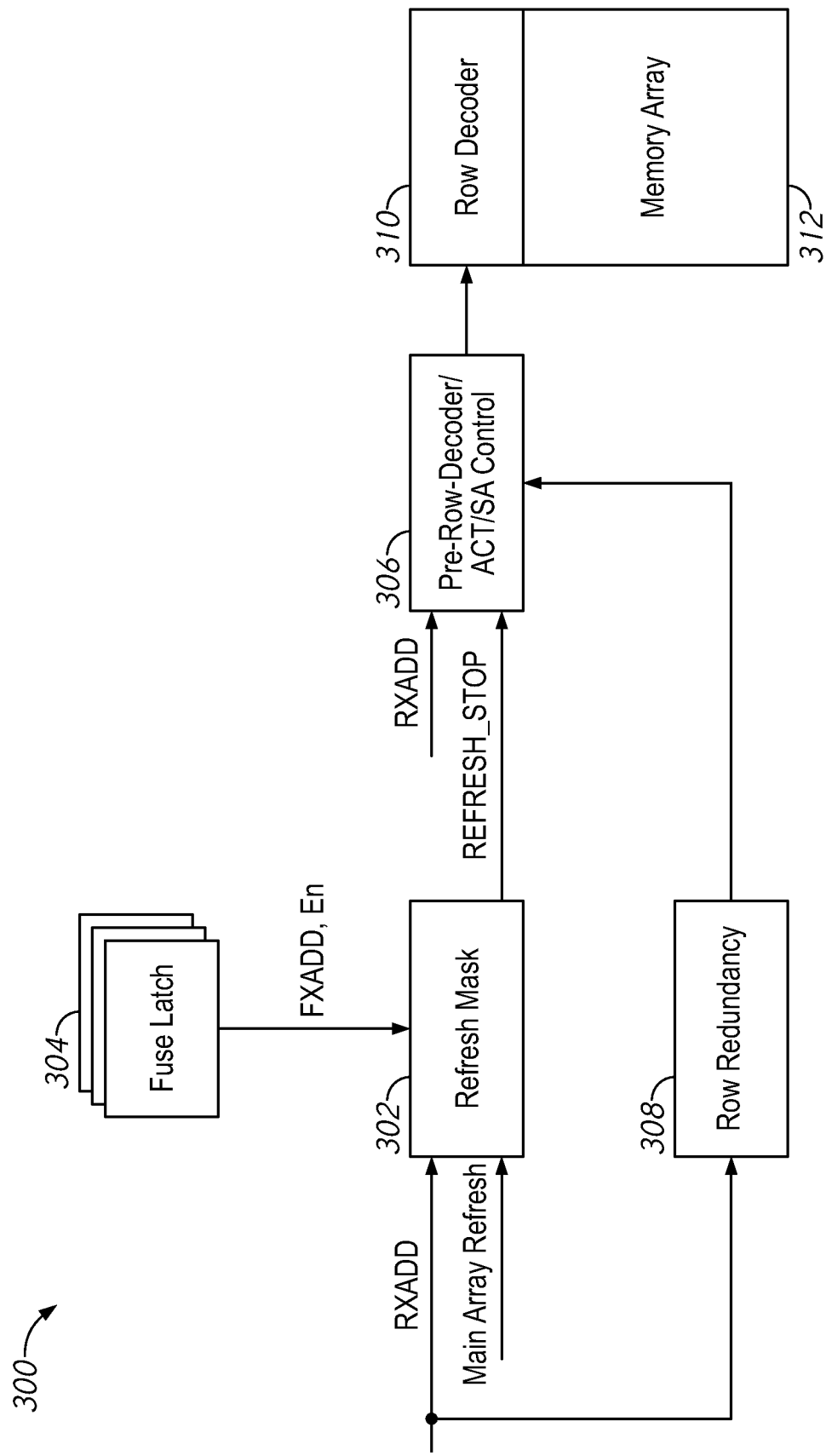
FIG. 3 is a block diagram of refresh masking logic according to some embodiments of the present disclosure.

FIG. 3 is a block diagram of refresh masking logic according to some embodiments of the present disclosure. The refresh masking logic 300 highlights components which are used in a refresh mask operation. For example, the components of the refresh masking logic 300 may, in some embodiments, represent components of the refresh control circuit 200 of FIG. 2 as well as other components of the memory (e.g., 100 of FIG. 1).

The refresh mask circuit 302 receives a refresh address RXADD along with a main array refresh signal. The main array refresh signal indicates that the refresh address is in the main section of the memory array (e.g., the refresh address RXADD is not associated with a redundant row). In some embodiments, it may not be necessary to mask the refresh address if a redundant row is being refreshed. Accordingly, the refresh mask circuit 302 may be active when the main array refresh signal is active. In some embodiments, the refresh mask circuit 302 may receive one or more additional signals (e.g., IREF/RHR of FIG. 2) which indicate whether the refresh address RXADD is associated with an CBR refresh operation (e.g., is a CBR address) or a targeted refresh operation. In some embodiments, the refresh mask 302 may be able to determine the type of refresh address RXADD based on the address itself. For example, if the refresh address RXADD is truncated then it is a CBR address.

The refresh mask circuit 302 also receives a selected address FXADD and an enable signal. In the embodiment of the FIG. 3, the selected address FXADD and the enable signal En are both provided from a fuse latch 304. The fuse latch 304 may be coupled to a fuse array of the memory. The fuse latch 304 may store bits based on the state of fuses in the fuse array which are associated with the selected address FXADD and enable signal En. Although not shown in FIG. 3, the selected address FXADD and enable signal En may be bank specific. Accordingly, the fuse array may store multiple fuse addresses and enable signals, which may be broadcast out and stored in the fuse latches 304 associated with the bank.

The selected address FXADD represents an address which has been identified as dangerous to the memory if the word line associated with the selected address is activated. For example, during testing, different rows of the memory may be tested for various characteristics. Based on those results various rows may be repaired. In addition, if a row fails a particular test (and/or falls below certain metrics, etc.) its address may be programmed in as the selected address FXADD. In addition, an enable bit En may be activated to indicate that the refresh mask circuit 302 should be used. In some embodiments, the selected address FXADD may also be a repaired word line (e.g., no data is stored on the word line associated with the selected address FXADD, and when the selected address is accessed, a defective word line is accessed).

If the enable signal En and the main array refresh signal are both active, then the refresh mask circuit 302 may compare the refresh address (or CBR address) RXADD to the selected address FXADD. If there is a match, the refresh mask circuit 302 provides the refresh stop signal REFRESH_STOP at an active level (e.g., a logical high).

The pre-row-decoder 306 receives the signal REFRESH_STOP and the refresh address RXADD. The pre-row-decoder 306 and row decoder 310 may provide various signals to activate the word lines of the memory array 312 based on the received signals. For example, when the refresh address RXADD is received and the signal REFRESH_STOP is inactive, the pre-row-decoder 306 and row-decoder 310 may activate one or more word lines associated with the refresh address RXADD and refresh the memory cells along the activated row(s). When the refresh address RXADD is received and the signal REFRESH_STOP is active, then the pre-row-decoder 306 and row decoder 310 may keep the wordline(s) associated with the refresh address RXADD inactive, and may skip refreshing those word line(s).

The refresh control circuit (e.g., 200 of FIG. 2) may also include an optional row redundancy circuit 308. The row redundancy circuit may receive the refresh address RXADD and determine if any of the word line(s) associated with the refresh address RXADD are repaired addresses (e.g., and now those addresses are assigned to a redundant word line of the memory array 312). The row redundancy circuit 308 may signal the pre-row-decoder 306 to activate the redundant row so that it is refreshed.

Figure 6:
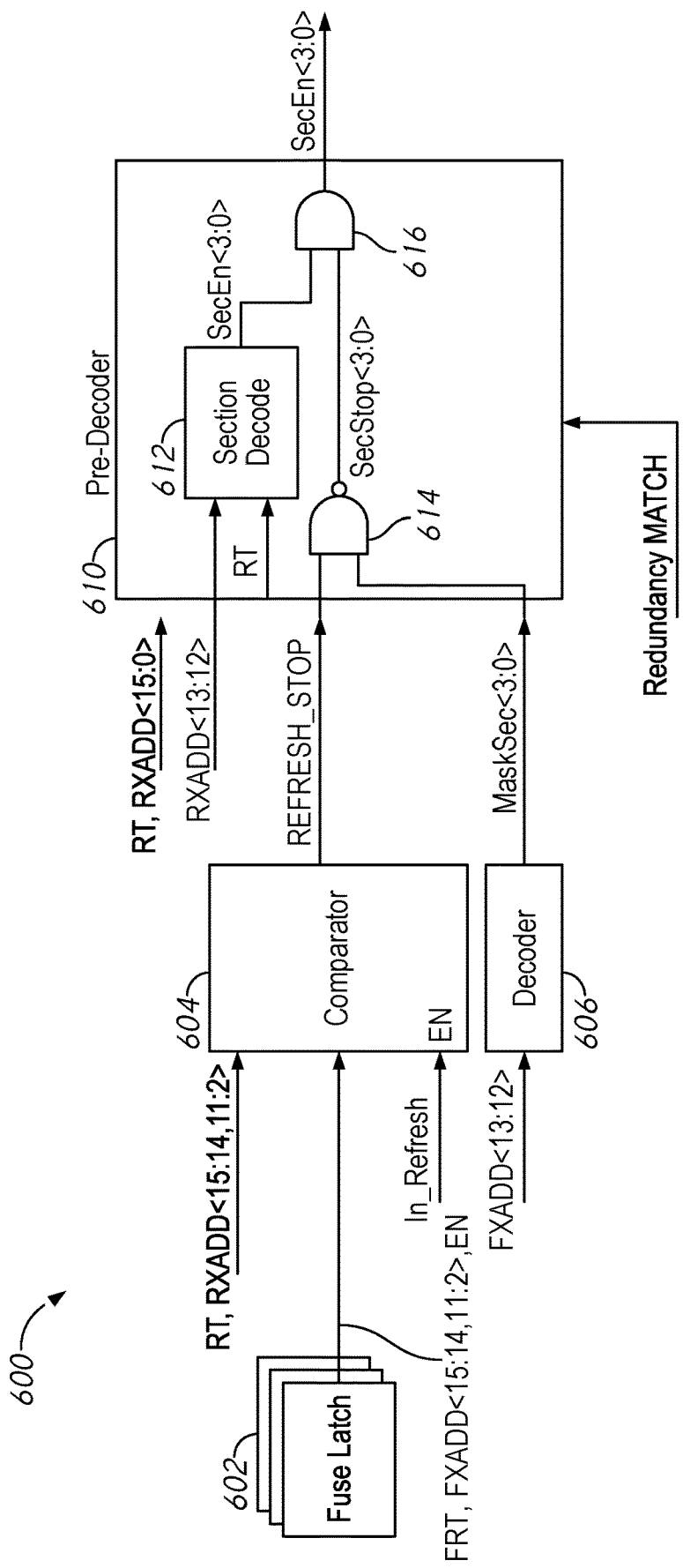
FIG. 6 is a schematic diagram of refresh masking logic according to some embodiments of the present disclosure.

In some embodiments, the row redundancy circuit 308 may be used during normal access operations to determine if an address is repaired or not, but may be disabled during refresh operations. In such embodiments, the CBR refresh address RXADD may include information about whether or not the refresh address is in a main or redundant section of memory. For example, the CBR address generator (e.g., 240 of FIG. 2) may generate main array addresses followed by redundancy addresses. The CBR refresh address RXADD may indicate whether it is associated with main or redundant sections of the memory array. For example, the CBR address RXADD may include an additional bit which indicates if the address is associated with main or redundant memory regions. FIG. 6 discusses an example embodiment using an extra redundancy bit in more detail.

Figure 4:
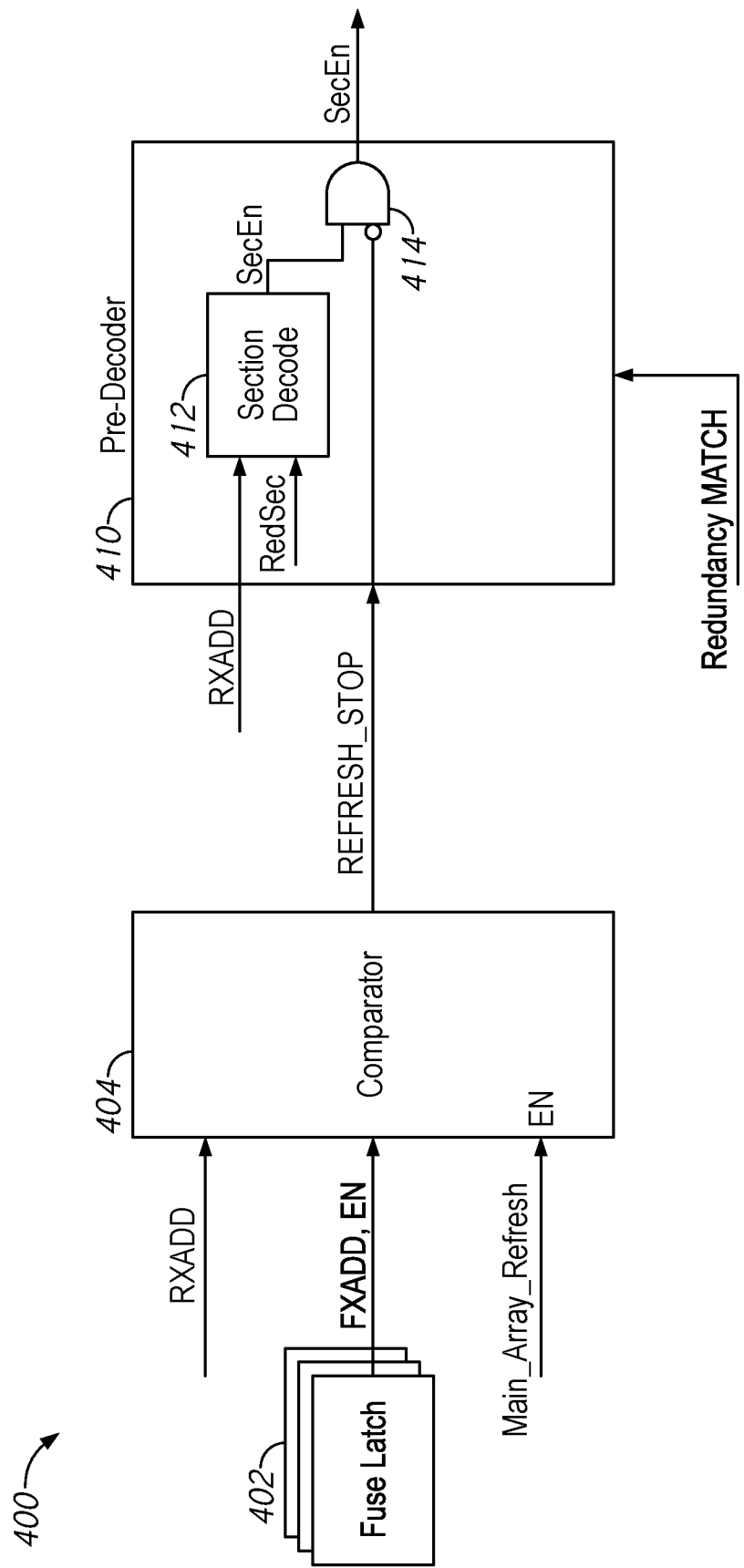
FIG. 4 is a schematic diagram of refresh masking logic according to some embodiments of the present disclosure.

FIG. 4 is a schematic diagram of refresh masking logic according to some embodiments of the present disclosure. The refresh masking logic 400 may, in some embodiments be included in the refresh control circuit 118 and row decoder 108 of FIG. 1, the refresh mask 242 and row decoder 208 of FIG. 2, and/or refresh masking logic 300 of FIG. 3, in some embodiments. In particular, the refresh masking logic 400 may represent a more detailed view of certain components described with respect to FIG. 3. For the sake of brevity, features and operations similar to those already described with respect to FIG. 3 will not be repeated again with respect to FIG. 4.

The refresh masking logic 400 includes a fuse latch 402 which stores a selected address FXADD and enable signal provided from a fuse array (e.g., 128 of FIG. 1). The fuse address FXADD and enable signal may be specific to a bank that the refresh masking logic is associated with.

A comparator 404 receives the selected address FXADD and enable signal from the fuse latch 402. The comparator 404 also receives a main array refresh signal Main_Array_Refresh which is active (e.g., at a high logical level) when a refresh operation is being performed on a main section (e.g., not a redundant section) of the memory array. When both the signal EN and Main_Array_Refresh are active, the comparator 404 may be active, and may compare, the selected address FXADD to the refresh address RXADD, which is a CBR refresh address (e.g., RXADD1 of FIG. 2).

As previously discussed, in some embodiments the refresh address RXADD may be truncated such that it is associated with multiple word lines. For example, if a normal row address (e.g., XADD of FIG. 1) is 16 bits, then 2 bits may be truncated from the refresh address RXADD to associated it with four word lines. For example, the refresh address may take the form RXADD<15:14, 11:2> with the bits 13 and 12 truncated out (bits 0 and 1 may be unused for purposes of refreshing). The bits 13 and 12 may act as a section address, and when not truncated may indicate a specific section of the memory bank. However, since the bits 13 and 12 are truncated out of the refresh address RXADD, all four sections may activate to refresh the four word lines which share RXADD<15:14, 11:2> in common. In some embodiments more bits may be truncated (e.g., leading to more word lines being associated with the refresh address). In some embodiments, fewer bits may be truncated or no bits may be truncated (e.g., only one word line is associated with the refresh address).

In some embodiments, the selected address FXADD may be truncated in a manner similar to the refresh address (e.g., FXADD may take the form FXADD<15:14, 11:2>). In some embodiments, the selected address FXADD may represent a 'full' address (e.g., FXADD<15:2>) but the comparator 404 may ignore the bits which are truncated in the refresh address. If the comparator 404 determines that the selected address FXADD matches the refresh address RXADD (e.g., the state of each bit of FXADD matches a state of a corresponding bit of RXADD), then the signal REFRESH- _STOP may be provided at an active level (e.g. a high logical level). If there is not a match, or if the comparator is not active (e.g., because at least one of EN or Main_Array_Refresh is not active), then the signal REFRESH_STOP may be at an inactive level (e.g., a low logical level).

The row pre-decoder 410 receives the refresh address RXADD and the refresh stop signal REFRESH_STOP, and provides a section enable signal SecEn which activates a section of the memory array so that the word lines can be refreshed. In the embodiment of FIG. 4, the bits of the refresh address RXADD which are truncated are a section address associated with a section of the memory array. In other embodiments where different portions of the row address are truncated, the pre-decoder 410 may include different components and/or provide a signal which enables different portions of the memory array than the section.

The pre-decoder 410 receives a redundancy match signal MATCH which is inactive during a main array refresh and during a redundant row refresh and active when a redundant row is accessed as part of an access operation. When the MATCH signal is active, the pre-decoder may be inactive.

The pre-decoder 410 includes a section decoder which generates the bits of the section enable signal SecEn based on a portion of the refresh address RXADD. The pre-decoder 410 may receive a non-truncated version of the refresh address RXADD. A section decoder 412 receives the truncated bits of the refresh address and decodes those bits to generate a section enable signal. For example, if the truncated refresh address takes the form RXADD<15:14, 11:2>, then the section decode 412 may receive RXADD<13:12> and generate a four bit enable signal SecEn<3:0>, one bit for each state of the two bits of the RXADD<13:12>. The section enable bits SecEn may be set to an active level in order to activate all four sections and refresh four word lines associated with the truncated refresh address RXADD.

The section enable signal SecEn is provided to an AND gate 414. The AND gate has a first input terminal coupled to the section decode circuit 412 to receive the signal SecEn and a second inverting input terminal coupled to the signal REFRESH_STOP. The inverting input terminal may invert a state of the signal REFRESH_STOP. For example there may be an inverter circuit (not shown) between the comparator 404 and the AND gate 414). Accordingly, the bits of the section enable signal SecEn will only be passed at an active level (e.g., a high logical level) when the signal REFRESH_STOP is at an inactive level. If the signal REFRESH_STOP is at an active level, then the signal SecEn will be suppressed and inactive (e.g., at a low logical level). In some embodiments the AND gate 414 may represent a sequence of AND gates, each with an input terminal coupled to one of the bits of the signal SecEn and an inverting input coupled to REFRESH_STOP.

Accordingly, in an example refresh operation, each refresh address RXADD may be associated with four wordlines, one in each of four sections. If the refresh address RXADD is not a match, then the section enable signal SecEn will be provided, and those four word lines will be refreshed as part of an CBR refresh operation. If one of the addresses in the refresh address RXADD matches the selected address FXADD, then the signal REFRESH_STOP will be provided at an active level, and none of the four word lines associated with RXADD will be refreshed. In some embodiments, when the selected address is identified, the other three word lines may be disabled and/or repaired so that data is not stored on those word lines.

Figure 5:
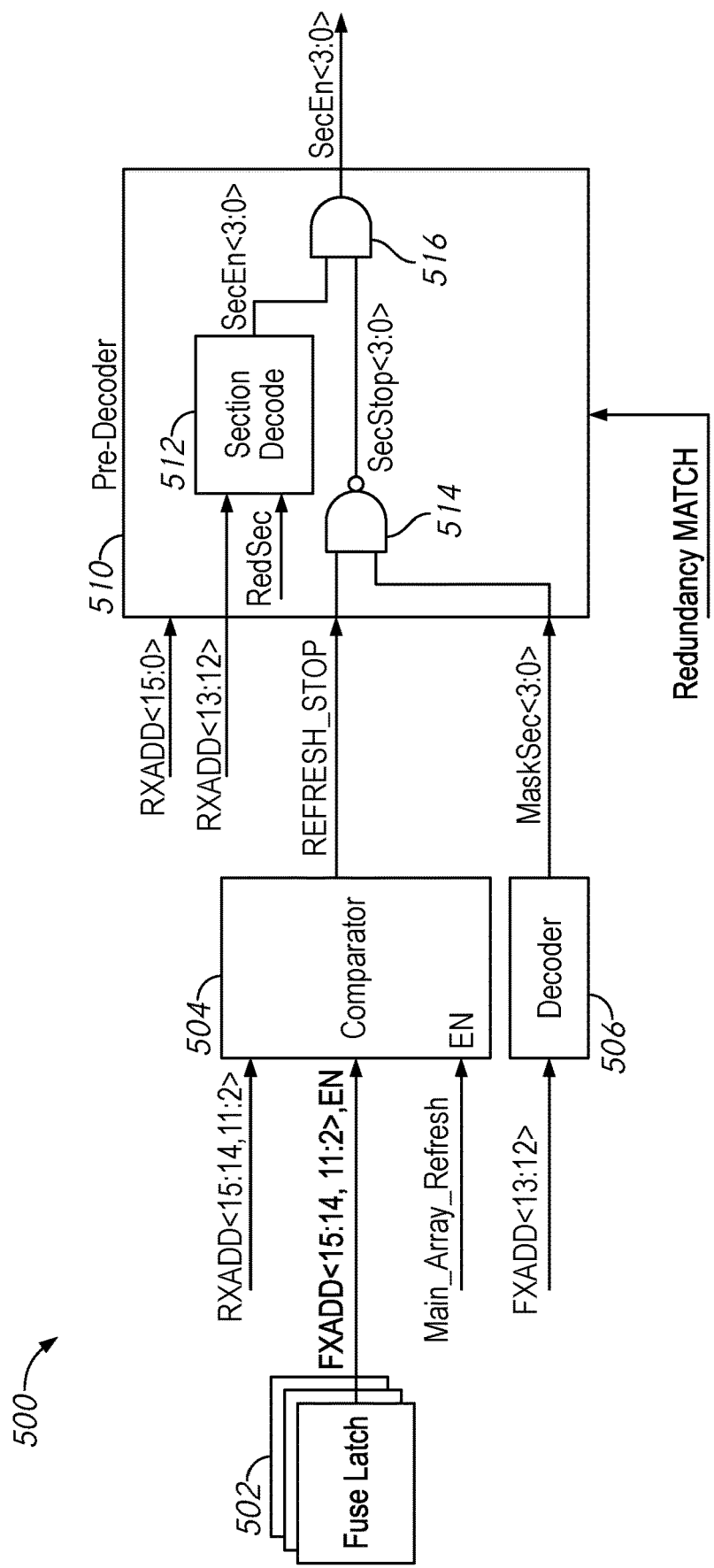
FIG. 5 is a schematic diagram of refresh masking logic according to some embodiments of the present disclosure.

FIG. 5 is a schematic diagram of refresh masking logic according to some embodiments of the present disclosure. The refresh masking logic 500 may generally be similar to the refresh masking logic 400 of FIG. 4, except that the refresh masking logic 500 allows for refreshing of the word lines grouped in the truncated RXADD which do not match the selected address FXADD. For example, if RXADD is associated with four word lines, then in the embodiment of FIG. 5, three of the four word lines will still be refreshed even if one of the wordlines has an address which matches the selected address FXADD. For the sake of brevity, features and components similar to those described with respect to FIG. 4 will not be repeated with respect to FIG. 5.

The refresh masking logic 500 includes a decoder 506 which receives the selected address FXADD. The decoder 506 may work in a manner similar to the section decoder 512. The decoder 506 receives bits of the selected address FXADD which correspond to the bits which are truncated out of the refresh address RXADD. Accordingly, if the refresh address RXADD is truncated to RXADD<15:14, 11:2>, then the selected address FXADD provided to the decoder 506 may take the form FXADD<13:12>. The decoder 506 generates a mask signal MaskSec. The mask signal MaskSec may have a number of bits based on the number of states of the truncated bits. For example, the mask signal MaskSec may be a four bit signal. The MaskSec signal may identify which of the four sections activated by the refresh address RXADD matches the selected address FXADD.

The pre-decoder 510 includes a NAND gate 514. The NAND gate 514 receives the REFRESH_STOP signal and the MaskSec signal. The NAND gate 514 provides a section stop signal SecStop, which has a number of bits based on the MaskSec signal. For example the SecStop signal may be a four bit signal. Each bit of the SecStop signal may be high unless both inputs (REFRESH_STOP and a corresponding bit of MaskSec) are both high. Accordingly, The only bits of SecStop which will be at a low logical level is a bit which indicates that the signal REFRESH_STOP is active and also that that particular bit of MaskSec represents the section which matches the selected address FXADD.

The pre-decoder 510 also includes an AND gate 516 which passes the bits of the section signal SecEn from the section decoder 512 as long as the corresponding bit of SecStop is at an active level. When a bit of SecStop is at an inactive level, then that bit of SecEn may be masked or suppressed (e.g., provided at an inactive level). Accordingly, each hit of SecEn may be passed except for the bit which matches the section encoded by the truncated bits of the selected address (e.g., FXADD<13:12>). This may allow the wordlines grouped together in the refresh address RXADD to all be refreshed except for the wordline indicated by the (non-truncated) selected address FXADD.

FIG. 6 is a schematic diagram of refresh masking logic according to some embodiments of the present disclosure. The refresh masking logic 600 of FIG. 6 may, in some embodiments, be included in the refresh masking logic of FIGS. 1-3. The refresh masking logic 600 may generally be similar to the refresh masking logic 400 of FIG. 4 and/or 500 of FIG. 5. For the sake of brevity, components and operations previously described with respect to FIGS. 4 and 5 will not be repeated again with respect to FIG. 6.

The refresh masking logic 600 represents an embodiment where a redundancy test signal RT is used, to allow the masking of rows whether the selected address FXADD is on the main array or in a redundant section of the array. The redundancy test signal RT may be included with addresses such as RXADD and FXADD. In some embodiments, the redundancy test signal RT may be an extra bit of the row address/refresh address/selected address. The signal RT may be active (e.g., at a logical high) when the address the signal RT is associated with is a redundant row, and may be inactive (e.g., logic low) otherwise.

In the embodiment of FIG. 6, the selected address FXADD and the refresh address RXADD (e.g., a CBR refresh address) each are associated with (e.g., include) a redundancy test signal FRT and RT respectively. The refresh address generator (e.g., CBR refresh address generator 240 of FIG. 2) may generate the refresh address RXADD (e.g., RXADD1 of FIG. 2) along with the signal RT. For example, the refresh address generator may refresh main array word lines and then generate CBR refresh addresses for the redundant word lines. When the generated CBR address is generated for a redundant word line, the signal RT may be active. Similarly, when the selected address FXADD is stored on the memory (e.g., programmed in the fuse array) it may be stored along with a fuse redundancy test signal FRT which indicates if the FXADD is a redundant row or not.

The comparator 604 may thus compare the refresh address RXADD and associated signal RT to the selected address FXADD and its associated signal FRT. When there is a match between the addresses and their two RT signals (e.g., a match between RT and FRT), while the comparator 604 is active, the comparator 604 may provide the signal REFRESH_STOP at the active level. In the embodiment of FIG. 6, the comparator 604 may have an enable signal coupled to a signal In_Refresh. The signal In_Refresh may be active when a refresh operation is occurring which is not a targeted refresh operation.

The pre-decoder 610 receives the refresh address RXADD and its associated RT signal. The section decoder 612 receives a portion of the refresh address RXADD (e.g., the part which is truncated out of the CBR address) and the RT signal. For example, the section decoder 612 may receive RXADD<13:12> and RT. The section decoder 612 may provide a section enable signal SecEn<3:0> which indicates a redundant row when the signal RT is active.

Figure 7:
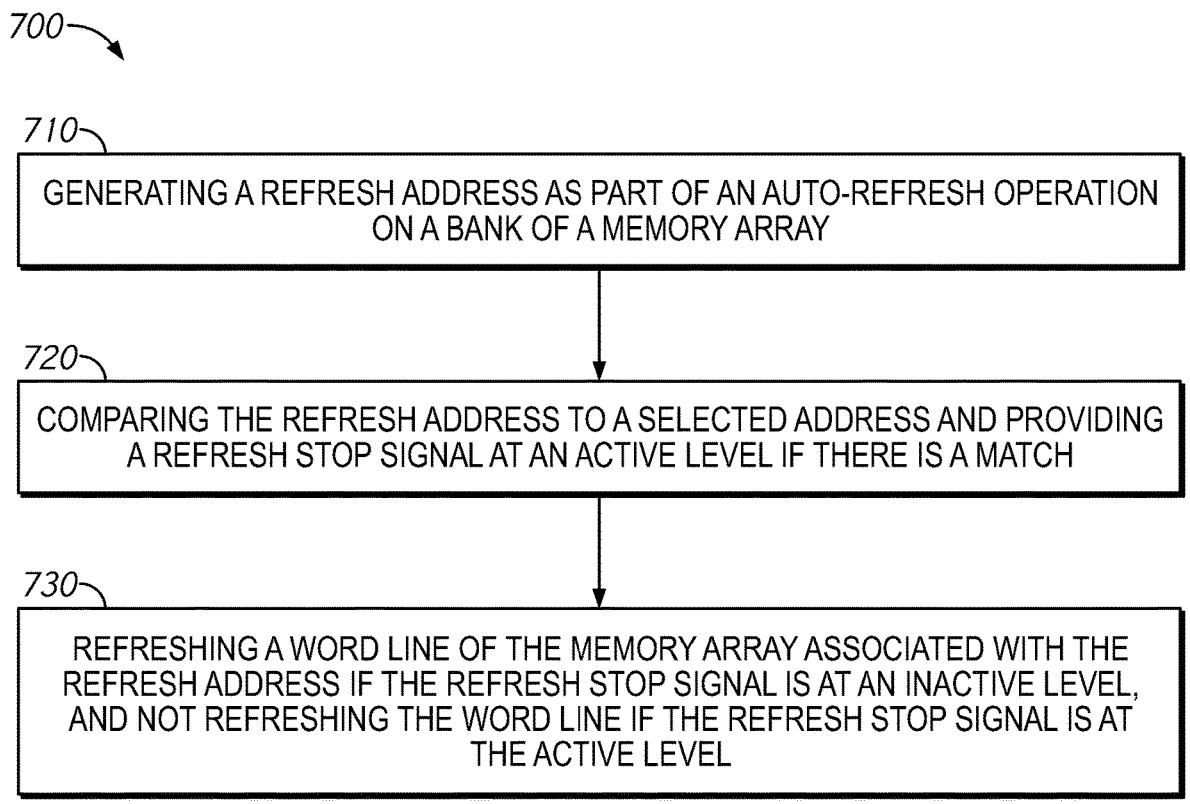
FIG. 7 is a flow chart of a method according to some embodiments of the present disclosure.

FIG. 7 is a flow chart of a method according to some embodiments of the present disclosure. The method 700 may, in some embodiments, be executed by one or more of the apparatuses described in FIGS. 1-6.

The method 700 includes block 710 which describes generating a refresh address as part of a CBR refresh operation on a bank of a memory array. The refresh address may be a CBR refresh address (e.g., RXADD1 of FIG. 2). It may be generated from a sequence (e.g., by advancing a counter). The refresh address may be truncated so that it is associated with multiple word lines.

Block 710 may be followed by block 720, which describes comparing the refresh address to a selected address and providing a refresh stop signal at an active level if there is a match. If there is not a match then the refresh stop signal may be provided at an inactive level.

Block 720 may generally be followed by block 730, which describes refreshing a word line of the memory array associated with the refresh address if the refresh stop signal is at an inactive level, and not refreshing the word line if the refresh stop signal is at the active level.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a fuse latch configured to store a selected address;
a refresh address generator configured to generate a refresh address as part of an application operation, wherein the refresh address is associated with a plurality of word lines;
a section decoder configured to generate a section enable signal based on the refresh address;
a comparator configured to provide a refresh stop signal at an active level if the selected address matches the refresh address;
a logic circuit configured to pass the section enable signal if the refresh stop signal is inactive and configured to suppress the section enable signal if the refresh stop signal is active; and
a row decoder configured to refresh a word line associated with the refresh address if the refresh stop signal is inactive and configured to not refresh the word line if the refresh stop signal is active, wherein all of the plurality of word lines are not refreshed if the refresh stop signal is active.

2. An apparatus, comprising:
a fuse latch configured to store a selected address;
a refresh address generator configured to generate a refresh address as part of an application operation, wherein the refresh address is associated with a plurality of word lines and wherein the selected address is associated with one of the plurality of word lines;
a comparator configured to provide a refresh stop signal at an active level if the selected address matches the refresh address;
a row decoder configured to refresh a word line associated with the refresh address if the refresh stop signal is inactive and configured to not refresh the word line if the refresh stop signal is active, wherein the one of the plurality of word lines is not refreshed and a remainder of the plurality of word lines are refreshed when the refresh stop signal is active;
a first decoder configured to generate a section enable signal based on the refresh address, wherein the section enable signal has a number of bits, each associated with a word line; and
a second decoder configured to generate a section mask signal based on the selected address, wherein the section mask signal has a number of bits corresponding to the number of bits of the section enable signal, and wherein one of the section mask bits is active based on the selected address, and wherein one of the number of bits of the section enable signal associated with the active bit of the section mask signal is suppressed.

3. The apparatus of claim 1, wherein the selected address is associated with a defective word line of a memory array.

4. The apparatus of claim 1, wherein the selected address is associated with one of a plurality of banks of a memory array.

5. An apparatus comprising:
a plurality of memory banks;
a plurality of fuse latches, each configured to store a selected address associated with one of the plurality of memory banks;
a plurality of section decoders each configured to generate a section enable signal based on a refresh address;
a plurality of comparators each configured to provide a refresh stop signal at an active level if the selected address matches the refresh address;
a plurality of logic circuits each configured to pass the section enable signal if the refresh stop signal is inactive and each configured to suppress the section enable signal if the refresh stop signal is active; and
a plurality of refresh circuits, each associated with one of the plurality of memory banks, wherein each of the plurality of refresh circuits is configured to generate the refresh address as part of a refresh operation on the associated bank, refresh a word line associated with the refresh address if the refresh stop signal is inactive and not refresh the word line if the refresh stop signal is active, wherein the refresh address is associated with a plurality of word lines, and wherein all of the plurality of word lines are not refreshed if the refresh stop signal is active.

6. The apparatus of claim 5, wherein each of the selected addresses is associated with a defective word line in the associated one of the plurality of memory banks.

7. The apparatus of claim 5, wherein the refresh address is associated with a plurality of word lines in the associated one of the plurality of memory banks.

8. The apparatus of claim 7, wherein if there is match between the selected address and the refresh address none of the plurality of word lines associated with the refresh address are refreshed.

9. The apparatus of claim 7, wherein the selected address is associated with one of the plurality of word lines, and wherein if there is a match between the selected address and the refresh address, then the one of the plurality of word lines is not refreshed and a remainder of the plurality of word lines are refreshed.

10. The apparatus of claim 7, wherein the plurality of word lines represent a word line in each of a plurality of sections of the associated one of the plurality of memory banks.

11. A method comprising:
generating, by a refresh address generator, a refresh address as part of a refresh operation on a bank of a memory array, wherein the refresh address is associated with a plurality of word lines;
generating, by a section decoder, a section enable signal based on the refresh address;
comparing, by a comparator, the refresh address to a selected address stored in a fuse latch and providing a refresh stop signal at an active level if there is a match;
passing, by a logic circuit, the section enable signal if the refresh stop signal is inactive and suppressing, by the logic circuit, the section enable signal if the refresh stop signal is active; and
refreshing, by a row decoder, a word line of the memory array associated with the refresh address if the refresh stop signal is at an inactive level, and not refreshing the word line if the refresh stop signal is at the active level, wherein all of the plurality of word lines are not refreshed if the refresh stop signal is active.

12. The method of claim 11, further comprising refreshing a plurality of word lines associated with the refresh address.

13. The method of claim 12, further comprising refreshing the plurality of word lines in each of a plurality of sections of the bank.

14. The method of claim 12, further comprising not refreshing any of the plurality of word lines when the refresh stop signal is at the active level.

15. The method of claim 14, further comprising repairing the plurality of word lines.

16. The method of claim 12, wherein one of the plurality of word lines is associated with the selected address, and wherein the method further comprising not refreshing the one of the plurality of word lines and refreshing a remainder of the plurality of word lines when the refresh stop signal is at the active level.

17. The method of claim 11, further comprising identifying the selected address by determining that a word line associated with the selected address is defective.

\* \* \* \* \*